(12) United States Patent
Harvey

(10) Patent No.: US 7,468,547 B2
(45) Date of Patent: Dec. 23, 2008

(54) RF-COUPLED DIGITAL ISOLATOR

(75) Inventor: Barry Harvey, Los Altos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/877,333

(22) Filed: Oct. 23, 2007

(65) Prior Publication Data
US 2008/0278255 A1 Nov. 13, 2008

Related U.S. Application Data

(60) Provisional application No. 60/973,020, filed on Sep. 17, 2007, provisional application No. 60/928,856, filed on May 11, 2007.

(51) Int. Cl.
*H01L 23/48* (2006.01)
*H01L 23/495* (2006.01)
*H05K 7/00* (2006.01)

(52) U.S. Cl. ................. 257/666; 257/725; 361/814; 361/820

(58) Field of Classification Search ........... 257/666, 257/725; 361/814, 820
See application file for complete search history.

(56) References Cited

U.S. PATENT DOCUMENTS

| | | | |
|---|---|---|---|
| 5,162,970 A | | 11/1992 | Davis, Jr. et al. |
| 5,428,245 A * | | 6/1995 | Lin et al. ............... 257/666 |
| 5,444,600 A * | | 8/1995 | Dobkin et al. ............ 361/303 |
| 5,589,709 A * | | 12/1996 | Dobkin et al. ............ 257/666 |
| 5,650,357 A * | | 7/1997 | Dobkin et al. ............ 438/107 |
| 5,926,358 A * | | 7/1999 | Dobkin et al. ............ 361/303 |
| 5,945,728 A * | | 8/1999 | Dobkin et al. ............ 257/666 |
| 6,621,140 B1 * | | 9/2003 | Gibson et al. ............ 257/531 |
| 7,064,442 B1 * | | 6/2006 | Lane et al. ............... 257/773 |
| 2004/0214376 A1 | | 10/2004 | Gibson |
| 2005/0271148 A1 | | 12/2005 | Dupuis |
| 2006/0214271 A1 * | | 9/2006 | Loraine et al. ........... 257/666 |

FOREIGN PATENT DOCUMENTS

JP 09260569 10/1997

OTHER PUBLICATIONS

"Digital Isolators," Silicon Laboratories, Inc. (2007), http://www.silabs.com/tgwWebApp/public/web_content/products/Digital_Power/Isolators/en/Si844x.htm.

(Continued)

*Primary Examiner*—Evan Pert
(74) *Attorney, Agent, or Firm*—Fliesler Meyer LLP

(57) ABSTRACT

An RF-coupled digital isolator includes a first leadframe portion and a second leadframe portion, electrically isolated from one another. The first leadframe portion includes a first main body and a first finger. The second leadframe portion includes a second main body and a second finger. The first main body is connected to a first ground, and the second main body is connected to a second ground that is electrically isolated from the first ground. The first finger and the second finger are electrically isolated from one another, e.g., by a plastic molding compound that forms a package for the digital isolator. The first finger acts as a primary of a transformer, and the second finger acts as a secondary of a transformer, when an RF signal drives to the first finger. The first finger and the second finger can be substantially parallel or anti-parallel to one another.

21 Claims, 8 Drawing Sheets

OTHER PUBLICATIONS

"3.3-V/5-V High Speed Isolators," ISO721, ISO721M, ISO722, ISO722M, Texas Instruments Incorporated (revised Feb. 2007), http://focus.ti.com/lit/ds/slls629d/slls629d.pdf.

"Dual Digital Isolator," IL711/712, NVE Corporation (Oct. 2002), http://home.nve.com/Downloads/il711-2t.pdf.

"Triple Channel Digital Isolators," ADuM1300/ADuM1301, Analog Devices (2003-2007), http://www.analog.com/UploadedFiles/Data_Sheets/ADUM1300_1301.pdf.

International Search Report and Written Opinion for PCT/US2008/057909.

* cited by examiner

RF-COUPLED DIGITAL ISOLATOR

FIELD OF THE INVENTION

This application claims priority under 35 U.S.C.119(e) to U.S. Provisional Application No. 60/928,856, filed May 11, 2007, and U.S. Provisional Patent Application No. 60/973,020, filed Sep. 17, 2007, each of which are incorporated herein by reference.

FIELD OF THE INVENTION

Embodiments of the present invention relate to isolators, and more specifically, to digital isolators that preferably operate at RF frequencies.

BACKGROUND

Isolation is important for various reasons. For example, isolation is important where common mode noise may be a problem. Isolation is also important where high-speed data transmission may be subject to interference due to magnetic fields, and the like. Additionally, isolation is important where the ground of two devices are not compatible. Further, isolation can be important to protect patients in medical applications. These are just a few examples, which are not meant to be limiting.

Various devices have been developed for providing isolation. For example, an optical isolator (also known as an opto-isolator, optocoupler, photocoupler, or photoMOS) is a device that uses a relatively short optical transmission path to transfer a signal between elements of one or more circuit, typically a transmitter and a receiver, while keeping them electrically isolated. However, a disadvantage of optical isolators is that they can not typically operate at high speeds often desired in digital communications. Additionally, since optical isolators require an optical transmitting element and an optical detecting element, the size, cost and power consumption of such devices is often greater than desired.

To overcome many of the deficiencies of optical isolators, digital isolators have been developed. Some digital isolators are capacitively coupled. However, such devices are often larger than desired and/or are not compatible with integrated circuit fabrication techniques. Other digital isolator devices combine high speed CMOS and air-core or magnetic-core transformer technology to support high data speeds and low power. However, such transformers typically rely on windings that often cause the size and cost of the transformers to be greater than desired.

SUMMARY

Embodiments of the present invention relate to RF-coupled digital isolators, and methods for providing digital isolation. In accordance with an embodiment of the present invention, an RF-coupled digital isolator includes a first leadframe portion and a second leadframe portion, which are electrically isolated from one another. In accordance with specific embodiments, the first and second leadframe portions are portions of a split leadframe. The first leadframe portion includes a first main body and a first finger. The second leadframe portion includes a second main body and a second finger. The first main body is connected to a first ground, and the second main body is connected to a second ground that is electrically isolated from the first ground.

In accordance with an embodiment, the first finger and the second finger are electrically isolated from one another by a plastic molding compound that forms a package for the digital isolator. In accordance with an embodiment, the first finger acts as a primary of a transformer, and the second finger acts as a secondary of a transformer, when a radio frequency (RF) signal drives to the first finger. In certain embodiments, the first finger and the second finger are substantially parallel to one another. In other embodiments, the first and second fingers are substantially anti-parallel to one another. In some embodiments, the first finger and the second finger are each substantially straight. In other embodiments, the first and second fingers are curved, e.g., substantially spiral, yet still substantially parallel or anti-parallel to one another.

In accordance with some embodiments, a first die is mounted on the first main body, and a second die mounted on the second main body. A first bondwire connects the first die to the first finger, and a second bondwire connects the second die to the second finger. In accordance with certain embodiments, the first die includes an oscillator that generates the RF signal used to drive the first finger. The second die can include an amplifier that amplifies a signal generated by the second finger when the RF signal drives the first finger. The first die can also include a modulator, and the second die can also include a demodulator. The modulator within the first die can control the oscillator, based on one or more control signal provided to the first die. The demodulator can demodulate a signal output by the amplifier, and can provide a demodulated output signal to an output of the second die.

Further embodiments, and the features, aspects, and advantages of the present invention will become more apparent from the detailed description set forth below, the drawings and the claims.

DETAILED DESCRIPTION

Figure 1A:
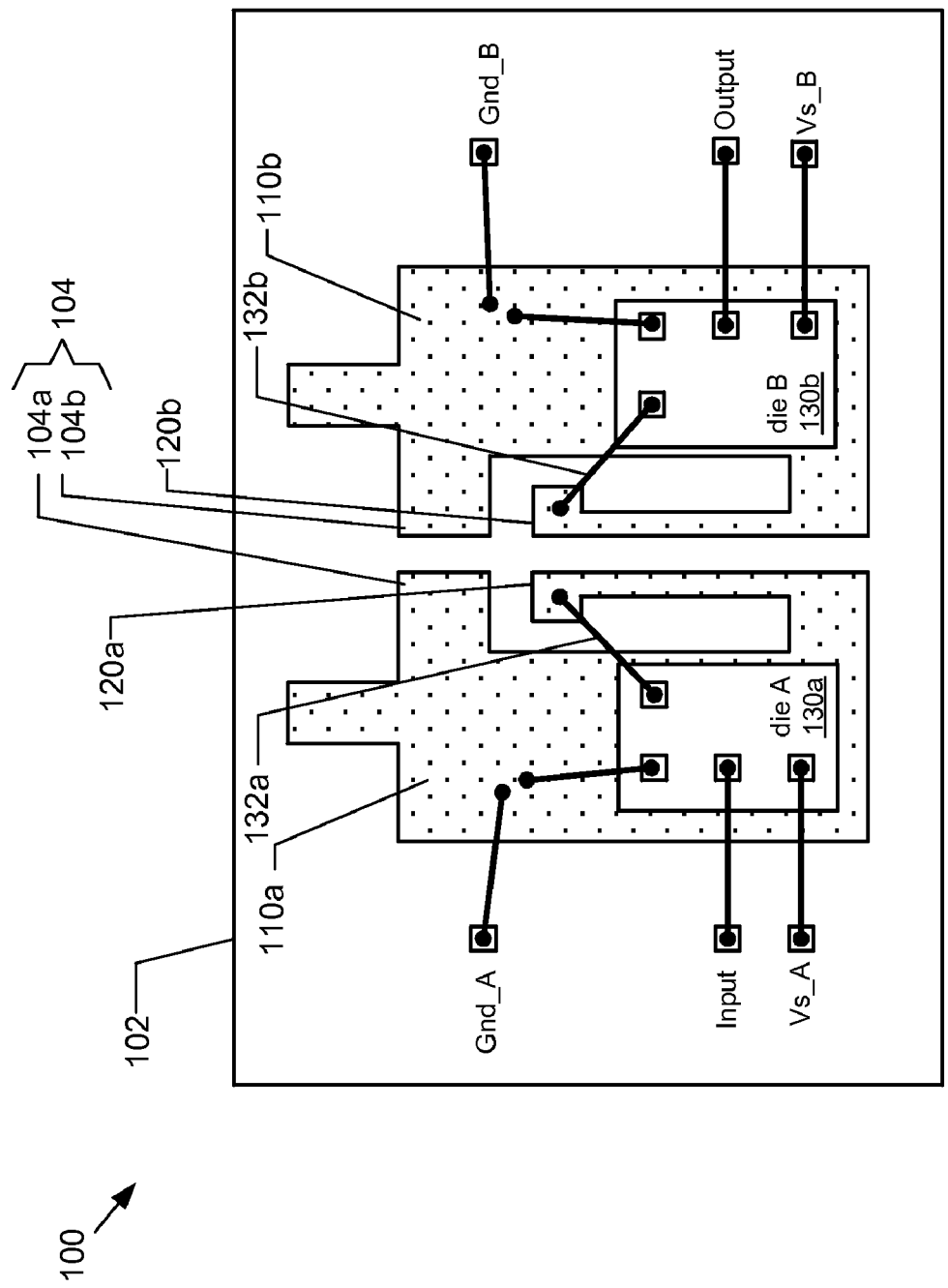
FIG. 1A illustrates an RF-coupled digital isolator, according to an embodiment of the present invention.

FIG. 1A illustrates an RF-coupled digital isolator (often referred to hereafter simply as a digital isolator) 100, according to an embodiment of the present invention. The digital isolator 100 includes a split leadframe 104, including a first leadframe portion 104a and a second leadframe portion 104b. The leadframe portions 104a and 104b are encapsulated in an encapsulating material (e.g., plastic) to form a package 102 for the digital isolator. Each leadframe portion 104a and 104b can be made, for example, of a stamped or etched copper or steel alloy that is plated, but is not limited thereto.

Each leadframe portion 104a and 104b includes a corresponding main body 110a and 110b and a corresponding finger 120a and 120b. The fingers 120a and 120b, which are isolated from one another by package material (e.g., plastic molding compound), collectively provide a transformer, which may also be referred to as a "finger transformer". In this embodiment, the finger 120a acts as a primary of the transformer, and the finger 120b acts as a secondary of the transformer, when a radio frequency (RF) signal drives to the finger 120a.

Additionally, a die 130a (also referred to as "die A") is mounted on the main body 110a of the leadframe portion 104a, and a die 130b (also referred to as "die B") is mounted on the main body 110b of the leadframe portion 104b. The die 130a can include an integrated circuit that provides transmission capabilities, and thus may also be referred to as a transmitter die. The die 130b can include an integrated circuit that provides receiving capabilities, and thus may also be referred to as a receiver die. It is also possible that each die 130a and 130b can provide for both transmitting and receiving capabilities, and thus may be transceiver dies. Such two way communications can be half-duplex.

The die 130a also includes a plurality of pads, represented by small squares within the die 130a. The pads of the die 130a are connected to components outside the die 130a via bond wires, represented by bold lines. One of the pads of the die 130a is connected to the finger 120a by a bond wire 132a. Another of the pads of the die 130a is connected via a ground bond wire to the main body 110a, which in turn is connected to a ground (i.e., Gnd_A) via another bond wire. A further pad of the die 130a receives an input signal. Still another pad of the die 130a receives a voltage (Vs_A) used to power the die 130a.

Similarly, the die 130b includes a plurality of pads, represented by small squares within the die 130b, which are connected to components outside the die 130b via bond wires, represented by bold lines. One of the pads of the die 130b is connected to the finger 120b by a bond wire 132b. Another of the pads of the die 130b is connected via a ground bond wire to the main body 110b, which in turn is connected to a ground (i.e., Gnd_B) via another bond wire. Gnd_A and Gnd_B are electrically isolated from one another. A further pad of the die 130b provides an output signal. Still another pad of the die 130b receives a voltage (Vs_B) used to power the die 130b. Where the dies 130a and 130b can function as transceivers, the same pad on each die can both receive an input, and provide an output, or separate pads can be provided for each function.

In FIG. 1A, the fingers 120a and 120b are shown as being parallel to one another. In an alternative embodiment, shown in FIG. 1B, an RF-coupled digital isolator 100' includes fingers 120a and 120b that are anti-parallel to one another, which causes them to be anti-phase (i.e., 180 degrees out of phase). There is a parasitic capacitive coupling between the fingers 120a and 120b when the fingers are parallel to one another, as well as when the fingers are anti-parallel to one another. However, a benefit of the fingers being anti-parallel to one another is that the parasitic capacitive coupling in the anti-parallel configuration increases signal transfer, due to the phrase relationships between the magnetic and coupling modes. In contrast, the parasitic capacitive coupling in the parallel configuration will reduce signal transfer.

Figure 1B:
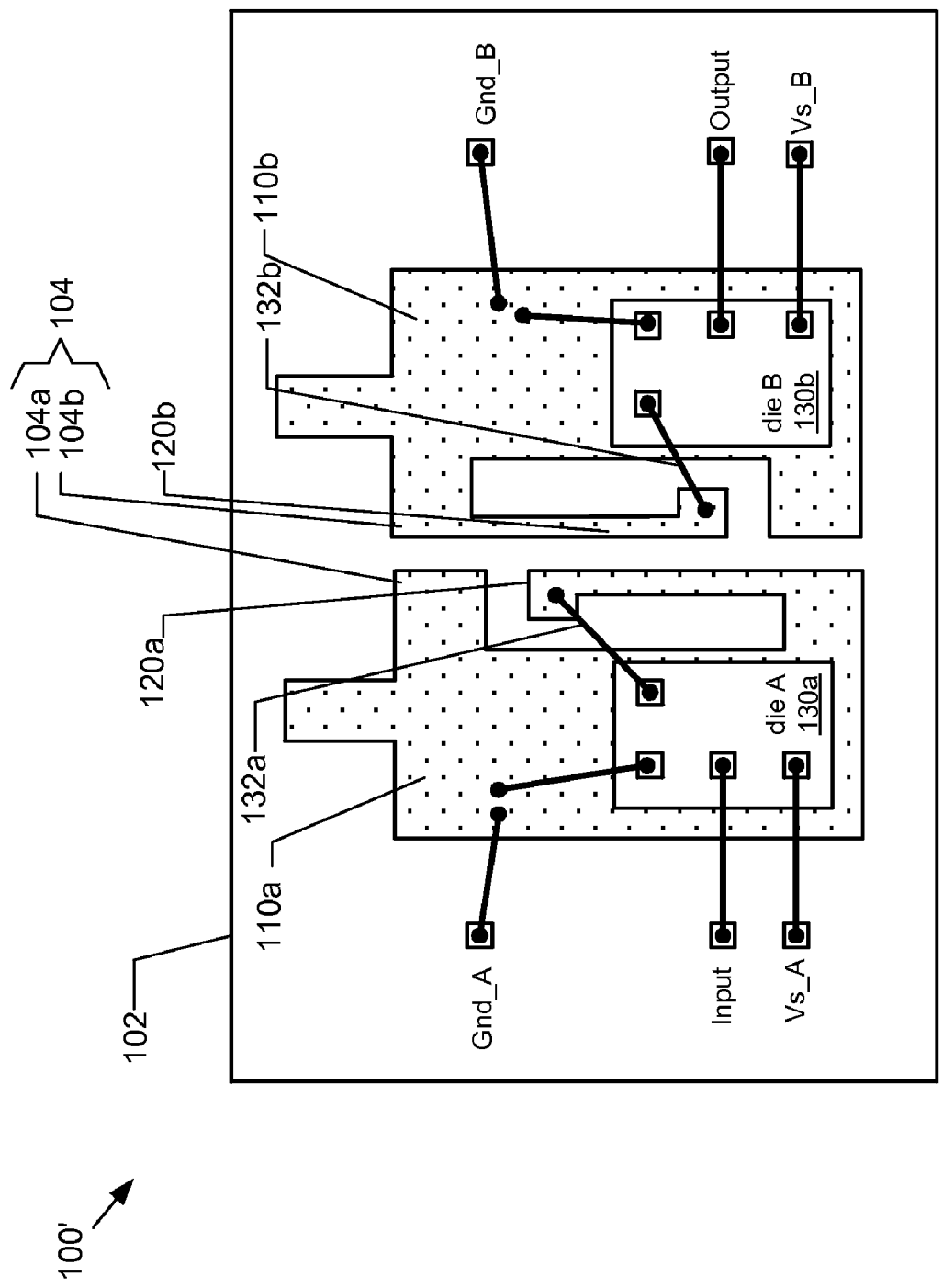
FIG. 1B illustrates an RF-coupled digital isolator, according to another embodiment of the present invention.
Figure 1C:
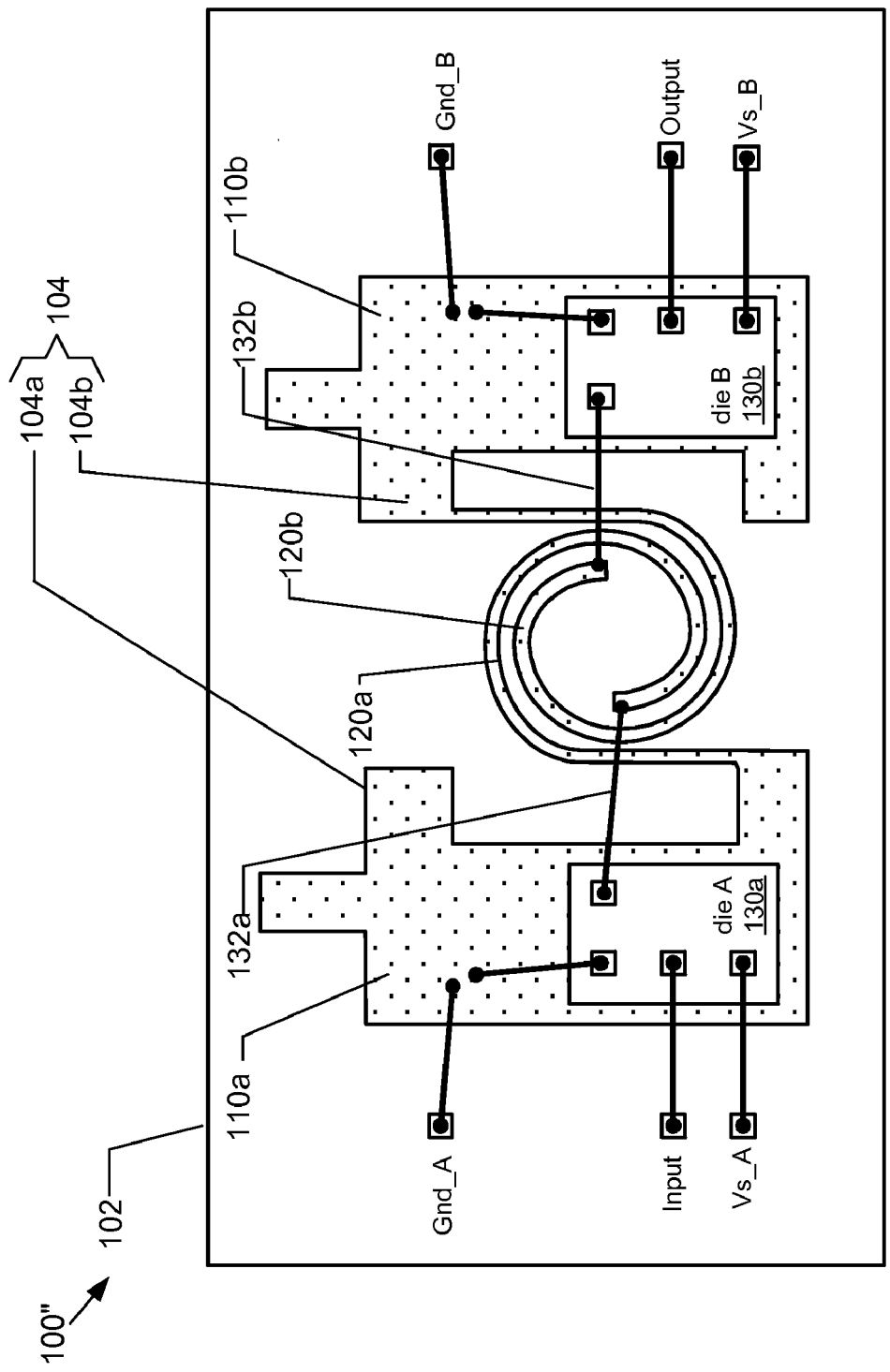
FIG. 1C illustrates an RF-coupled digital isolator, according to a further embodiment of the present invention.

In FIGS. 1A and 1B the fingers 120a and 120b are shown as being substantially straight, however that need not be the case, as can be appreciated from FIG. 1C. More specifically, FIG. 1C shows an embodiment of an RF-coupled digital isolator 100" where the fingers 120a and 120b are anti-parallel, but the fingers 120a and 120b are spiraling, which has the affect of increasing their mutual coupling inductance (and thus, increasing their coefficient of coupling). The fingers 120a and 120b in FIG. 1C can alternatively be parallel to one another. Similar or common reference numbers in the figures, including FIGS. 1A-1C, are used to reference similar components or elements.

The distance between the fingers 120a and 120b, the shape of the fingers 120a and 120b, and the length of the fingers 120a and 120b, affects the parasitic capacitance ($C_{parasitic}$) between the fingers and the coefficient of coupling (K). An exemplary distance between the fingers 120a and 120b is 10 milli-inches, but other distances are also within the scope of the present invention.

Figure 2:
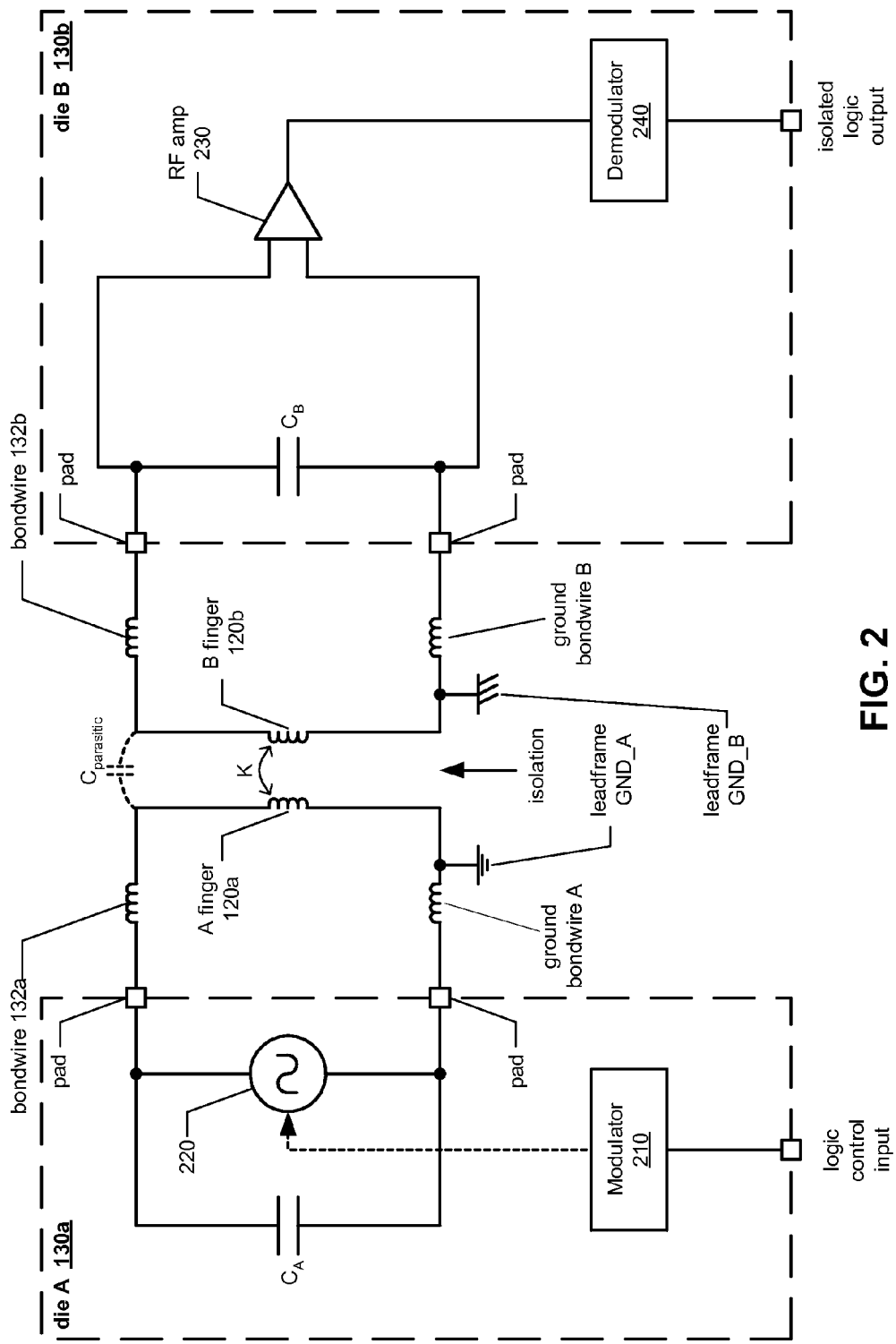
FIG. 2 is a high level circuit diagram that illustrates some additional details of the digital isolators of FIGS. 1A-1C, and which models some of the various elements of FIGS. 1A-1C as equivalent circuit components.

As will now be described with reference to FIG. 2, the die A (130a) forces a current preferably in the GHz range into the finger 120a, which returns into the leadframe main body 110a and back into die A's ground bond wire. The fingers 120a and 120b, which as mentioned above are isolated from one another, have a magnetic coupling and a mutual inductance. The parasitic capacitance is illustrated in FIG. 2 by the dashed line capacitor labeled $C_{parasitic}$. The coefficient of coupling is illustrated by the "K" in FIG. 2, indicating that there is a coefficient of coupling between the two fingers 120a and 120b (stated another way, there is a mutual inductance between the two fingers 120a and 120b). The transfer advantageously increases with frequency. Accordingly, high operating frequencies are desired. The operating frequencies are preferably outside the frequency spectrums assigned to cell phones and Bluetooth devices. More specifically, it is desired that the operating frequency of the digital couplers of the present invention are greater than or less than 2.4 GHz. In specific embodiments, the operating frequency is nominally ~3 GHz.

Referring to the circuit diagram of FIG. 2, some additional details of the dies 130a and 130b are provided and various bond wires are shown as inductors, due to their inductive qualities. Additionally, in FIG. 2, each of the fingers 120a and 120b is also shown as an inductor, also due to their inductive qualities. The die 130a is also shown as including an oscillator 220 and a modulator 210. In accordance with specific embodiments, the oscillator 220 produces an oscillating signal of ~3 GHz and ~3 milliamp peak-to-peak (mApp), although signals of lower or higher frequencies and/or lower or higher amplitudes are also possible and within the scope of the present invention. The modulator 210 receives one or more input signal lines, which instruct the modulator 210 how to control the oscillator 220. Where simple binary modulation (also known as "on/off modulation") is used, the modulator 210 can be as simple as a buffer, as shown at 310 in FIG. 3. Any other modulation technique that is known, or developed in the future, can alternatively be used, including, but not limited to, amplitude modulation, quadrature modulation, etc.

Figure 3:
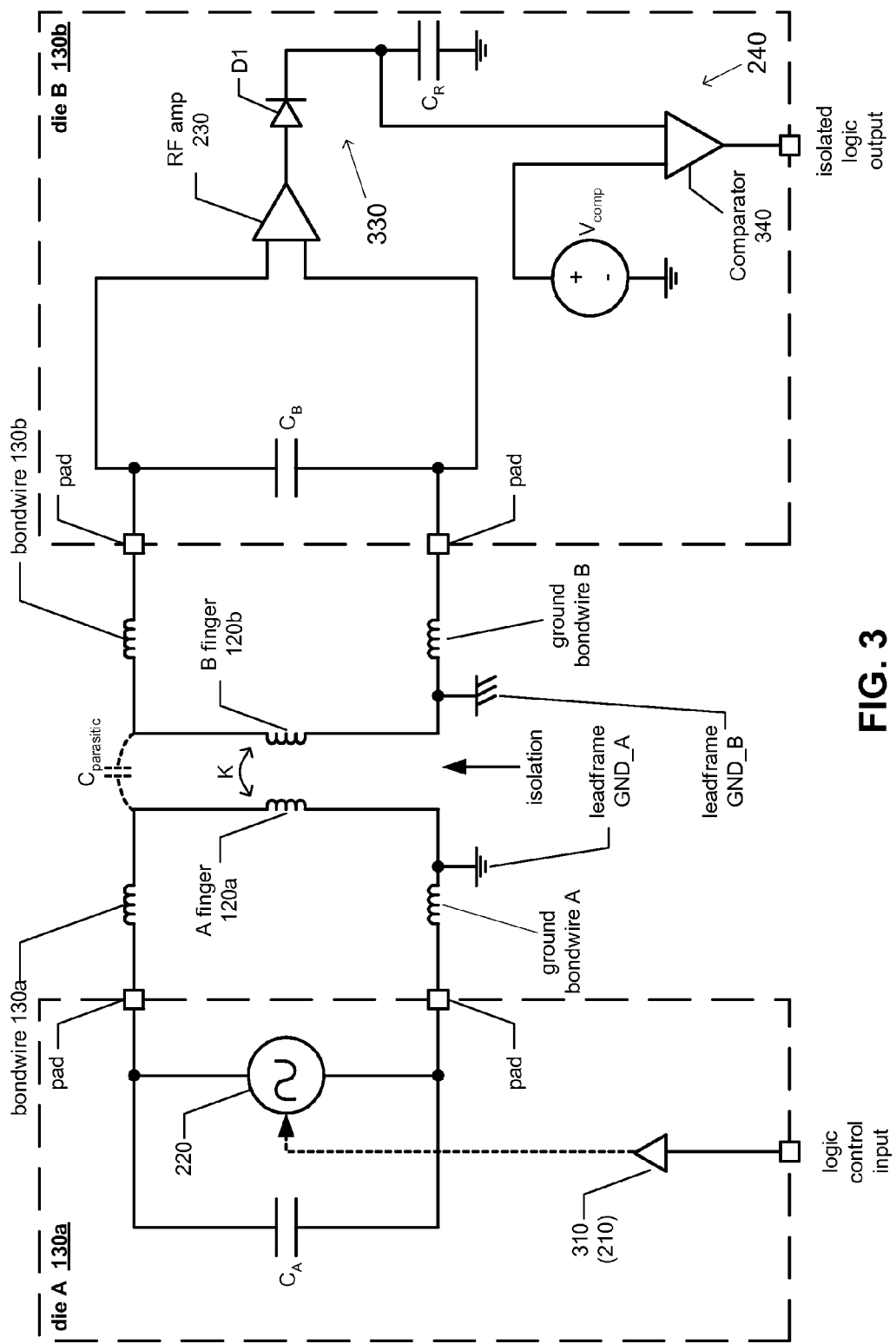
FIG. 3 is a high level circuit diagram that provides some additional details to the diagram of FIG. 2, where simple binary modulation is used.

Returning to the circuit diagram of FIG. 2, the die 130b is shown as including an RF amplifier 230 and a demodulator 240. The RF amplifier 230 amplifies the signal received by the finger 120b, and provides the amplified signal to the demodulator 240. The type of demodulator used should correspond to the type of modulation provided by the modulator 210. For example, where simple binary modulation is used, the demodulator 240 can include a rectifier 330 followed by a comparator 340, as shown in FIG. 3. FIG. 3 also illustrates that the rectifier 330 can include a diode D1 and a capacitor $C_R$, but is not limited thereto.

Returning again to FIG. 2, each of the dies 130a and 130b optionally also includes a tuning capacitor, labeled $C_A$ and $C_B$, used to tune the resonance of the circuit of each die. The parasitic capacitance ($C_{parasitic}$), mutual inductance (M), and coefficient of coupling (K) between the fingers 120a and 120b also affect the resonance. Accordingly, the dimensions of the fingers 120a and 120b, distance therebetween, and components of the circuits of each die 130a and 130b (including the values of tuning capacitors $C_A$ and $C_B$) can be selected to provide a desired resonance.

Still referring to FIG. 2, a logic input signal provided to die A (130a) causes the oscillator 220 to oscillate and provide an RF signal to the finger transformer. More specifically, an oscillating signal is provided from the oscillator 220, via the bond wire 132a, to the finger 120a. The oscillating current (and/or voltage) provided to the finger 120a causes an oscillating current (and/or voltage) at the second finger 120b, which is amplified by the amplifier 230. The output of the amplifier 230 is demodulated by the demodulator 240.

In accordance with specific embodiments of the present invention, presuming a 3 GHz oscillation frequency, and ~3 mApp drive signal from die A (130a), the output of the finger transformer can recover ~45 millivolts peak-to-peak (mVpp). Presuming a Q of ~3 at each die 130a and 130b, ~400 mVpp can be recovered when resonating with capacitors $C_A$ and $C_B$.

As mentioned above, the circuit shown in FIG. 2 can be used for one way transmission of a signal, e.g., from die A to die B, or for two way half-duplex communication. To provide for two way half-duplex communication, die A can also include an RF-amp and a demodulator, and die B can also include an oscillator and a modulator. Alternatively, a die similar to die B can also be mounted on the main body 110a of the leadframe portion 104a, and a die similar to die A can also be mounted on the main body 110b of the leadframe portion 104b. In other words, each lead frame portion 110a and 110b can include a die for transmitting signals and a separate die for receiving signals, or a common die can be for both transmitting and receiving signals.

Each leadframe portion 104a and 104b need only include one finger, where half-duplex communication is used. For example, referring to FIGS. 1A-1C, the finger 120a can be used for transmitting signals, as well as receiving signals, so long as the transmitting and receiving are occurring at different times, as is the case in half-duplex communication.

Figure 4A:
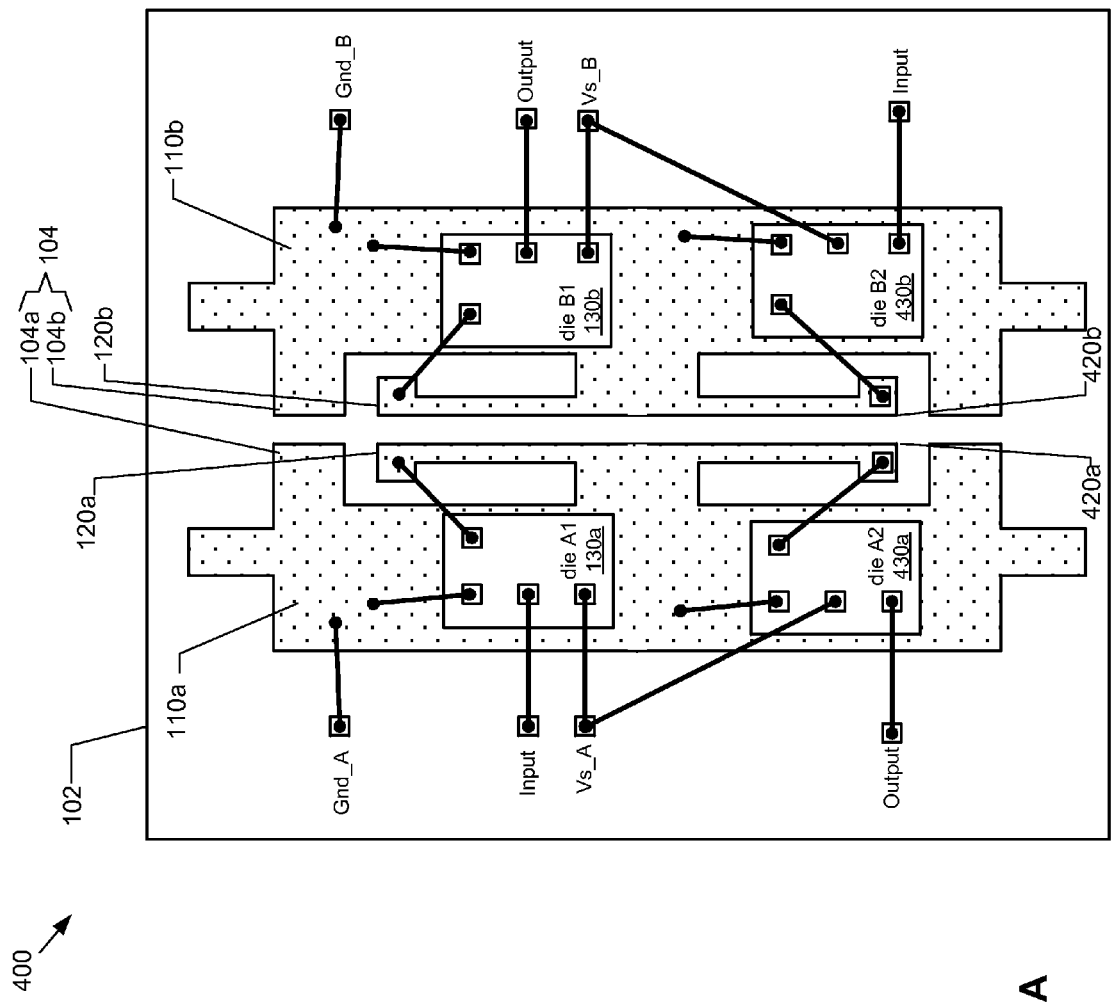
FIG. 4A illustrates an RF-coupled digital isolator, according to an embodiment of the present invention, which can provide for full-duplex communication.
Figure 4B:
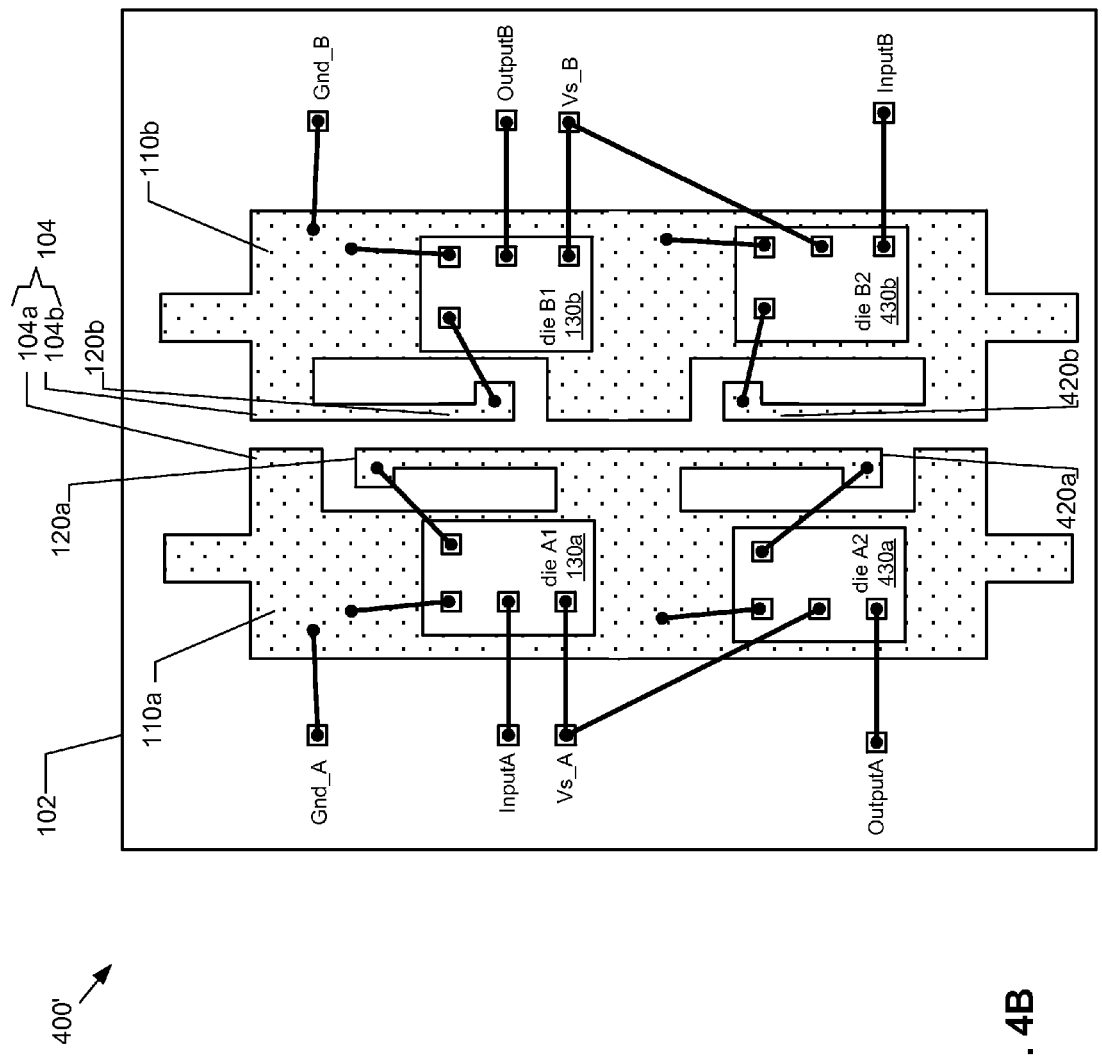
FIG. 4B illustrates an RF-coupled digital isolator, according to another embodiment of the present invention, which can also provide for full-duplex communication.

Alternatively, each of the leadframe portions 104a and 104b can have an additional finger, as shown in FIGS. 4A and 4B. Referring to FIGS. 4A and 4B, the leadframe portion 104a is shown as also having a finger 420a, and the leadframe portion 104b is shown as also having a finger 420b. The additional fingers 420a and 420b, which are isolated from one another by package material (e.g., plastic molding compound) collectively provide a second transformer, which may also be referred to as a second "finger transformer". FIGS. 4A and 4B differ from one another, in that in FIG. 4A each pair of fingers that form a finger transformer are parallel to one another, where in FIG. 4B each pair of fingers that form a finger transformer are anti-parallel to one another. While the fingers in FIGS. 4A and 4B are shown as being substantially straight, that need not be the case, as can be appreciated from FIG. 1C discussed above. In the embodiments of FIGS. 4A and 4B, when the fingers 120a and 420b are driven by RF signals, the fingers 120a and 120b act, respectively, as the primary and secondary of the first finger transformer, and the fingers 420b and 420a act, respectively, as the primary and secondary of the second finger transformer.

Referring to the digital isolators 400 and 400' of FIGS. 4A and 4B, the finger 120a can be dedicated to transmitting signals and the finger 420a can be dedicated to receiving signals, or vice versa. Similarly, the finger 120b can be dedicated to receiving signals, and the finger 420b can be dedicated to transmitting signals, or vice versa. In this manner, full duplex communication can be provided.

FIGS. 4A and 4B also show two dies 130a and 430a mounted on the leadframe portion 104a, and two dies 130b and 430b mounted on the leadframe portion 104b. One die on each leadframe portion can be used for produce signals used to drive a finger for transmission (e.g., including performing modulation), and the other die on the leadframe portion can be used, e.g., for amplifying and demodulating received signals. Alternatively, the dies shown on each leadframe portion can be combined so that each leadframe portion has mounted thereon a single die used for both receiving and transmitting functions. It is also within the scope of the present invention to add one or more additional finger(s) to each leadframe portion. Also, it is possible to add one or more additional leadframe portion(s), i.e., use more than two leadframe portions, so that more isolation regions exist. For example, each leadframe portion shown in FIGS. 4A and 4B can be separated into two leadframe portions, resulting in four separate leadframe portions, each having a finger. Further, it is also noted that leadframe portions need not be symmetrical to one another, i.e., non-symmetrical layouts can also be used.

In certain embodiments, the digital isolator can be formed in a ceramic package, such as but not limited to a hermetic ceramic package. Such a ceramic package can include a lead frame embedded in a paste layer between ceramic top and bottom covers. In other words, the leadframe portions 104a and 104b that include a corresponding finger 120 and main body 110 can be embedded between ceramic layers. The dies (e.g., 130a and 130b) can be connected to a ceramic layer, which may or may not be the same layer on which the fingers 120 are formed. In such embodiments, air or some other gas can provide electrical isolation between a pair of fingers. It's also possible that the main bodies (e.g., 110a and 110b) and fingers (e.g., 120a and 120b) be formed directly on a ceramic layer using any of a variety of techniques, such as, but not limited to, chemical vapor deposition, sputtering, etching, photolithography, masking, etc. The dies (e.g., 130a and 130b) can be connected to such a layer, which may or may not be the same layer on which the fingers 120 are formed. Again, air or some other gas can provide electrical isolation between a pair of fingers. In still other embodiments, the digital isolator can be formed as a hybrid integrated circuit. For example, the main bodies (e.g., 110a and 110b) and fingers (e.g., 120a and 120b) can be formed on a printed circuit board, to which are attached the dies (e.g., 130a and 130b). In such embodiments, molding compound can provide electrical isolation and mechanical support between fingers. In the alternative embodiments just explained above, conductive traces and/or vias can be used in place of bond wires to connect dies to fingers, or bond wires can still be used.

An advantage of certain embodiments of the present invention is that a digital isolator can be provided by producing a transformer using a split leadframe and plastic molding compound that are available in typically chip assembly processes. An advantage of certain embodiments of the present invention is that no windings are necessary to provide a transformer for a digital isolator, likely reducing the size and cost of a resulting digital isolator. Another advantage of certain embodiments of the present invention is that the designs discussed above work well at high frequencies above cell phone and Bluetooth spectrums, and such embodiments, if tuned appropriately, can also inherently reject frequencies in the cell phone and Bluetooth spectrums.

Figure 5:
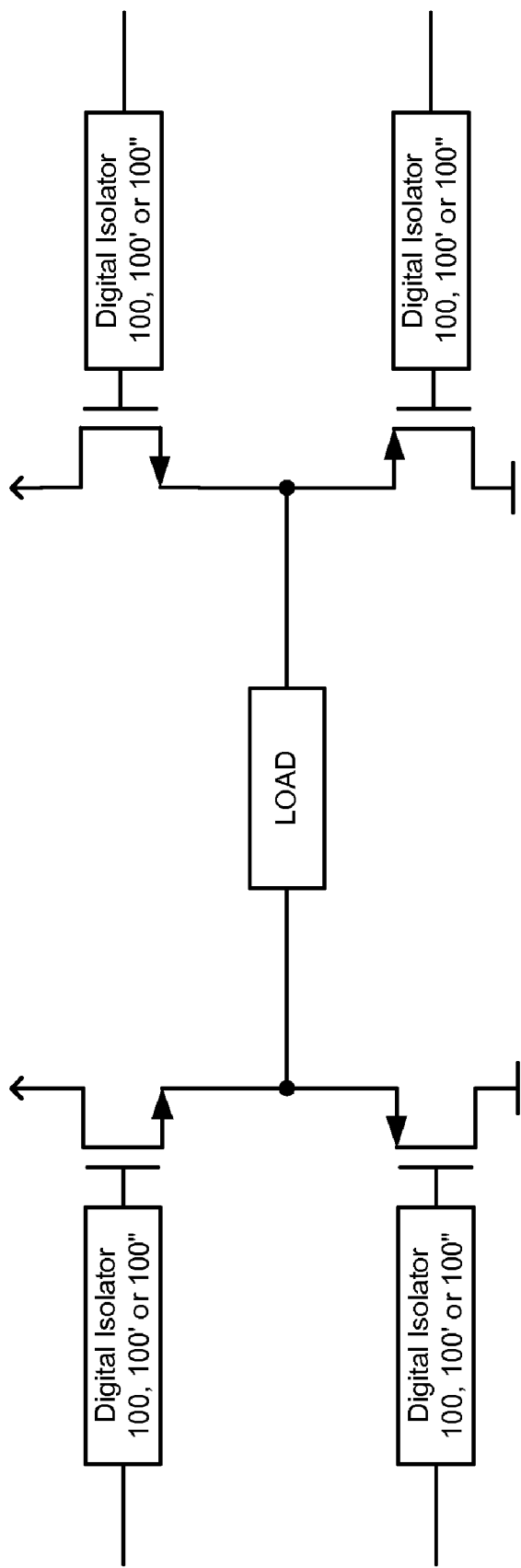
FIG. 5 illustrates an exemplary H-bridge circuit that can be implemented using the digital isolators of the present invention.

The RF-coupled digital isolators of the present invention can be used for numerous different applications. For example, the RF-coupled digital isolators can be used in a power H-bridge, e.g., in power supplies or motor controllers, e.g., as shown in FIG. 5. Other implementation of an H-bridge are also possible, and within the scope of the present invention.

Additionally, the RF-coupled digital isolators can be used to communicate with switching power transistors and power lines. Further, the RF-coupled digital isolators of the present invention can be used for long distance communications (e.g., RS485). The RF-coupled digital isolators of the present invention can be especially useful for power switching of 50 W or greater. The RF-coupled digital isolators of the present invention can also be used to reduce dead time for DC to DC converters, e.g., to 10 nsec. These are just a few applications for the digital isolators of the present invention, which are not meant to be limiting.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. It is intended that the scope of the invention be defined by the following claims and their equivalents.

What is claimed is:

1. An RF-coupled digital isolator, comprising:
   a first leadframe portion including a first main body and a first finger;
   a second leadframe portion including a second main body and a second finger, the second leadframe portion electrically isolated from the first leadframe portion;
   the first main body connected to a first ground;
   the second main body connected to a second ground that is electrically isolated from the first ground;
   a first die mounted on the first main body; and
   a second die mounted on the second main body;
   wherein the first finger and the second finger are electrically isolated from one another; and
   wherein the first finger acts as a primary of a transformer, and the second finger acts as a secondary of the transformer, when an RF signal drives the first finger.

2. The RF-coupled digital isolator of claim 1, wherein the first finger and the second finger are electrically isolated from one another by a molding compound that forms a package for the digital isolator.

3. The RF-coupled digital isolator of claim 1, further comprising:
   a first bondwire that connects the first die to the first finger; and
   a second bondwire that connects the second die to the second finger.

4. The RF-coupled digital isolator of claim 1, wherein the first and second leadframe portions are portions of a split leadframe.

5. The RF-coupled digital isolator of claim 1, wherein the first finger and the second finger are substantially parallel to one another.

6. The RF-coupled digital isolator of claim 5, wherein the first finger and the second finger are each substantially straight.

7. The RF-coupled digital isolator of claim 5, wherein the first finger and the second finger are each curved.

8. The RF-coupled digital isolator of claim 7, wherein the first finger and the second finger are substantially spiral.

9. The RF-coupled digital isolator of claim 1, wherein the first finger and the second finger are substantially anti-parallel to one another.

10. The RF-coupled digital isolator of claim 9, wherein the first finger and the second finger are each substantially straight.

11. The RF-coupled digital isolator of claim 9, wherein the first finger and the second finger are each curved.

12. The RF-coupled digital isolator of claim 11, wherein the first finger and the second finger are substantially spiral.

13. The RF-coupled digital isolator of claim 1, further comprising:
    an oscillator, within the first die, that generates the RF signal;
    a first bondwire that connects the first die to the first finger, and provides the RF signal from the first die to the first finger;
    a second bondwire that connects the second finger to the second die; and
    an amplifier within the second die that amplifies a signal generated by the second finger when the RF signal drives the first finger.

14. The RF-coupled digital isolator of claim 13, further comprising:
    a modulator within the first die; and
    a demodulator within the second die;
    wherein the modulator controls the oscillator, based on one or more control signal(s) provided to the first die; and
    wherein the demodulator demodulates a signal output by the amplifier and provides a demodulated output signal to an output of the second die.

15. An RF-coupled digital isolator, comprising:
    a split leadframe including a first leadframe portion and a second leadframe portion that are electrically isolated from one another;
    the first leadframe portion including a first finger; and
    the second leadframe portion including a second finger;
    wherein the first and second fingers, configured as a finger transformer, have a mutual inductance and a current in one said finger is detected by using current induced in the other said finger.

16. The RF-coupled digital isolator of claim 15, wherein:
    the first leadframe portion includes a first main body from which the first finger extends;
    the second leadframe portion includes a second main body from which the second finger extends; and
    when one of said fingers is driven by an RF signal, the said finger that is driven acts as a primary of a transformer, and the other said finger acts as a secondary of a transformer.

17. The RF-coupled digital isolator of claim 16, further comprising:
    a first die mounted on the first main body;
    a second die mounted on the second main body;
    a first bondwire that connects the first die to the first finger;
    a second bondwire that connects the second die to the second finger; and
    a plastic molding compound between the first and second fingers, to provide the electrical isolation between the fingers.

18. The RF-coupled digital isolator of claim 17, wherein:
    the first main body is connected to a first ground; and
    the second main body is connected to a second ground that is electrically isolated from the first ground.

19. A method for providing digital isolation, comprising:
driving a first finger of a first leadframe with an RF signal; and
detecting a signal at a second finger of a second leadframe, as a result of the first finger being driven by the RF signal and the mutual inductance between the first and second fingers,
wherein the first and second fingers are electrically isolated from one another and are configured as a finger transformer.

20. The method of claim 19, further comprising:
receiving an input signal;
performing modulation, based on the input signal, to produce the RF signal that drives the first finger; and
demodulating the signal detected at the second finger, or an amplified version thereof, to produce an output signal.

21. A system, comprising:
a first portion of a circuit;
a second portion of the circuit; and
a digital isolator between the first and second portions of the circuit;
wherein the digital isolator includes
a first leadframe portion including a first main body and a first finger;
a second leadframe portion including a second main body and a second finger, the second leadframe portion electrically isolated from the first leadframe portion;
the first main body connected to a first ground;
the second main body connected to a second ground that is electrically isolated from the first ground;
a first die mounted on the first main body; and
a second die mounted on the second main body;
wherein the first finger and the second finger are electrically isolated from one another; and
wherein the first finger acts as a primary of a transformer, and the second finger acts as a secondary of the transformer, when an RF signal drives the first finger.

* * * * *